US010780966B2

(12) United States Patent
Wei et al.

(10) Patent No.: US 10,780,966 B2
(45) Date of Patent: Sep. 22, 2020

(54) ROV PROPELLER TAILHOOD, ROV PROPELLER AND ROV

(71) Applicant: Tianjin Deepfar Ocean Technology Co., LTD, Tianjin (CN)

(72) Inventors: Jiancang Wei, Tianjin (CN); Chunhao Cui, Tianjin (CN)

(73) Assignee: Tianjin Deepfar Ocean Technology Co., LTD (CN)

( * ) Notice: Subject to any disclaimer, the term of this patent is extended or adjusted under 35 U.S.C. 154(b) by 0 days.

(21) Appl. No.: 16/074,932

(22) PCT Filed: Oct. 17, 2017

(86) PCT No.: PCT/CN2017/106490
§ 371 (c)(1),
(2) Date: Aug. 2, 2018

(87) PCT Pub. No.: WO2018/086442
PCT Pub. Date: May 17, 2018

(65) Prior Publication Data
US 2019/0031311 A1 Jan. 31, 2019

(30) Foreign Application Priority Data
Nov. 8, 2016 (CN) .......................... 2016 1 0981903

(51) Int. Cl.
*B63H 21/17* (2006.01)
*H05K 7/20* (2006.01)
(Continued)

(52) U.S. Cl.
CPC .............. *B63H 21/17* (2013.01); *B63C 11/48* (2013.01); *B63G 8/08* (2013.01); *H05K 5/03* (2013.01);
(Continued)

(58) Field of Classification Search
CPC ............ B63H 21/17; B63H 2005/1258; H05K 7/2039
See application file for complete search history.

(56) References Cited

U.S. PATENT DOCUMENTS

| 5,157,587 A | 10/1992 | Edwards |
| 2004/0070946 A1 | 4/2004 | Matsuo et al. |

(Continued)

FOREIGN PATENT DOCUMENTS

| CN | 202156532 U | 3/2012 |
| CN | 204713407 U | 10/2015 |

(Continued)

OTHER PUBLICATIONS

IBM Corp, Universal Option Card Heatsink, IBM Technical Disclosure Bulletin, Aug. 1993, pp. 411-412, vol. 36, No. 8.

*Primary Examiner* — Andrew Polay
(74) *Attorney, Agent, or Firm* — Forge IP, PLLC

(57) ABSTRACT

Disclosed is an ROV propeller tailhood comprising a body a control circuit board, a heat block, a thermal silica gel and long rod screws. The heat sink is fixed to the bottom of the control circuit board and disposed between the control circuit board and the body. The heat sink and the body are provided respectively with apertures that are matching with the long rod screws for fixing the heat sink to the body. The cooling silica gel is provided between the control circuit board and the heat sink.

16 Claims, 2 Drawing Sheets

(51) Int. Cl.
  *B63C 11/48*  (2006.01)
  *B63G 8/08*  (2006.01)
  *H05K 5/03*  (2006.01)
(52) U.S. Cl.
  CPC ....... *H05K 7/2039* (2013.01); *H05K 7/20463* (2013.01)

(56) References Cited

U.S. PATENT DOCUMENTS

2009/0116243 A1\* 5/2009 Condon ................. B60Q 1/02
                                                    362/294
2011/0026226 A1  2/2011 Zheng et al.
2015/0176817 A1\* 6/2015 Olsson .................. F21V 15/01
                                                    362/249.02

FOREIGN PATENT DOCUMENTS

| CN | 2016-02309 R | \* | 12/2015 | ............. H01M 2/34 |
| CN | 206149657 U  |    | 5/2017  |  |
| CN | 206218177 U  |    | 6/2017  |  |
| JP | 1992044190 U |    | 4/1992  |  |
| JP | 1996169397 A |    | 7/1996  |  |
| JP | 2004104115 A |    | 4/2004  |  |
| JP | 2013038119 A |    | 2/2013  |  |
| JP | 2013225554 A |    | 10/2013 |  |

\* cited by examiner

ROV PROPELLER TAILHOOD, ROV PROPELLER AND ROV

This disclosure claims all benefits of the Chinese patent application No. 201610981903.1 filed with the State Intellectual Property Office of the People's Republic of China on Nov. 8, 2016, titled "ROV propeller tailhood, ROV propeller and ROV", and hereby incorporated by reference herein in its entirety.

FIELD

The disclosure generally relates to ROV propeller, and more specifically to an ROV tailhood, an ROV propeller, and an ROV.

BACKGROUND

ROV (Remote Operated Vehicle) is a robot used for underwater observation, inspection and construction. Miniature ROV is energy self-supported and can operate nimbly. It can carry miniature camera and sensor so as to extend the observation range for a manned submersible with its ability of accessing to small or dangerous places where it is inconvenient for the manned submersible or even unable to get into an ROV is driven mainly by ROV propellers installed on both sides and tail of the ROV respectively. A brushless DC motor and a control circuit board are installed inside the ROV propellers. The control circuit board is used to receive wireless control instructions to control the speed and steering of the brushless DC motor from external intelligent wireless remote-control unit.

SUMMARY

In one aspect, this disclosure relates to an ROV propeller tailhood comprising a body, and further comprising a control circuit board, a heat sink, a cooling silica gel and a long rod screws, wherein the heat sink is fixed to the bottom of the control circuit board and disposed between the control circuit board and the body; the heat sink and the body are provided respectively with apertures matching with the long rod screws, and the long rod screws are used to fix the heat sink onto the body; the cooling silica gel is provided between the control circuit board and the heat sink.

In some embodiments, apertures in the heat sink are provided in the middle of the heat sink and the apertures in the body are provided in the middle of the end surface of the body.

In some embodiments, an upper surface area of the heat sink is smaller than the bottom area of the control circuit board, and the lower surface area of the heat sink is smaller than a surface area of an end surface of the body.

In some embodiments, the ROV propeller tailhood may further comprise a plurality of motor driver modules, one end of each motor driver module is fixed to the bottom of the control circuit board with the other end being fixed to the sidewall of the heat sink.

In some embodiments, an end of each motor drive module is fixed to the bottom of the control circuit board through a cooling column and the other end is fixed to the sidewall of the heat sink through a short rod screw.

In some embodiments, multiple motor drive modules are equally divided into two groups which are provided on the opposite sidewalls of the heat sink respectively.

In some embodiments, there is a preset distance between two adjacent motor drive modules in each group of motor drive modules.

In another aspect, this disclosure relates to an ROV propeller comprising an ROV tailhood as mentioned above, wherein an insulating paper is provided on the inner wall of a cavity formed by the ROV tailhood and a propeller front cover.

In some embodiments, the insulating paper is a highland barley paper.

In a further aspect, this disclosure relates to an ROV comprising the ROV propeller as mentioned above.

The ROV propeller tailhood provided by the disclosure disposes a heat sink, which is fixed to the bottom of the control circuit board between the control circuit board and the body. Apertures are arranged respectively corresponding to the long rod screws on the heat sink and the body. The long rod screws are used to fix the heat sink onto the body, thereby fixing the control circuit board onto the body, which provides a stable arrangement in the process of the ROV posture adjustment and guarantees the stability of the control circuit on the control circuit board.

In addition, due to the addition of heat sink on the basis of the heat dissipation silica gel, the heat dissipation performance is improved, which can ensure an efficient heat dissipation for the control circuit board during longtime working of ROV.

DETAILED DESCRIPTION OF THE INVENTION

A detailed description of the technical solution is provided hereinafter through the accompanying drawings and embodiments.

Figure 1:
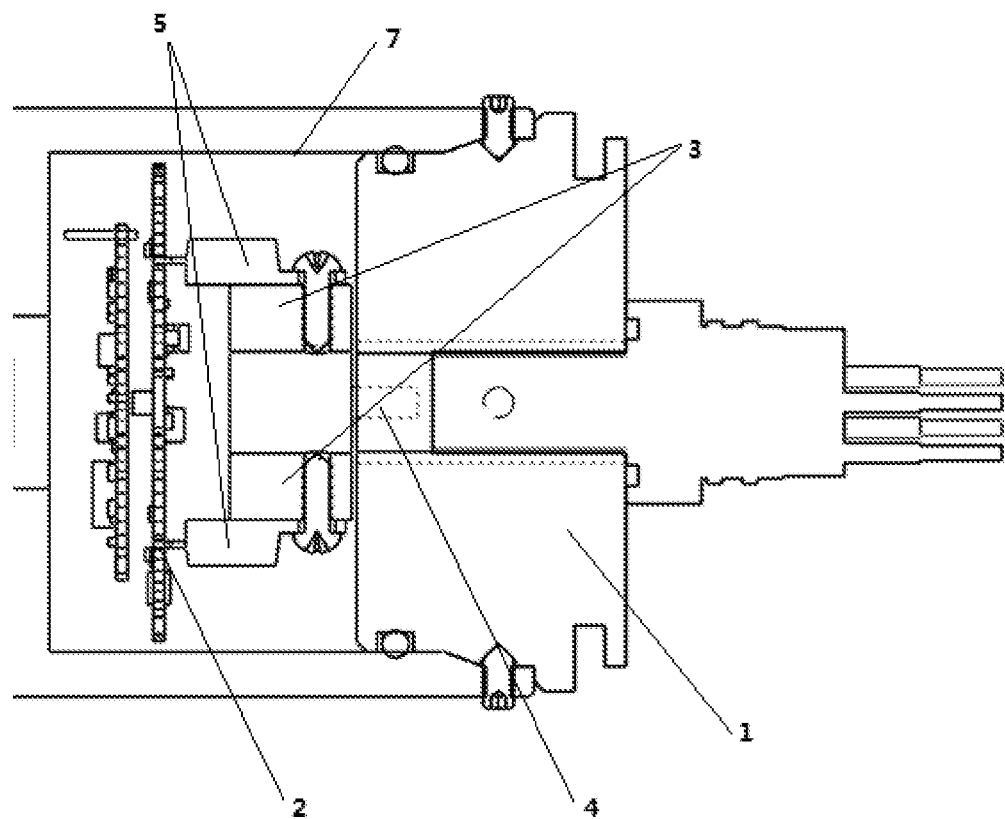
FIG. 1 is a section view of the propeller tailhood according to an embodiment of this disclosure.
Figure 2:
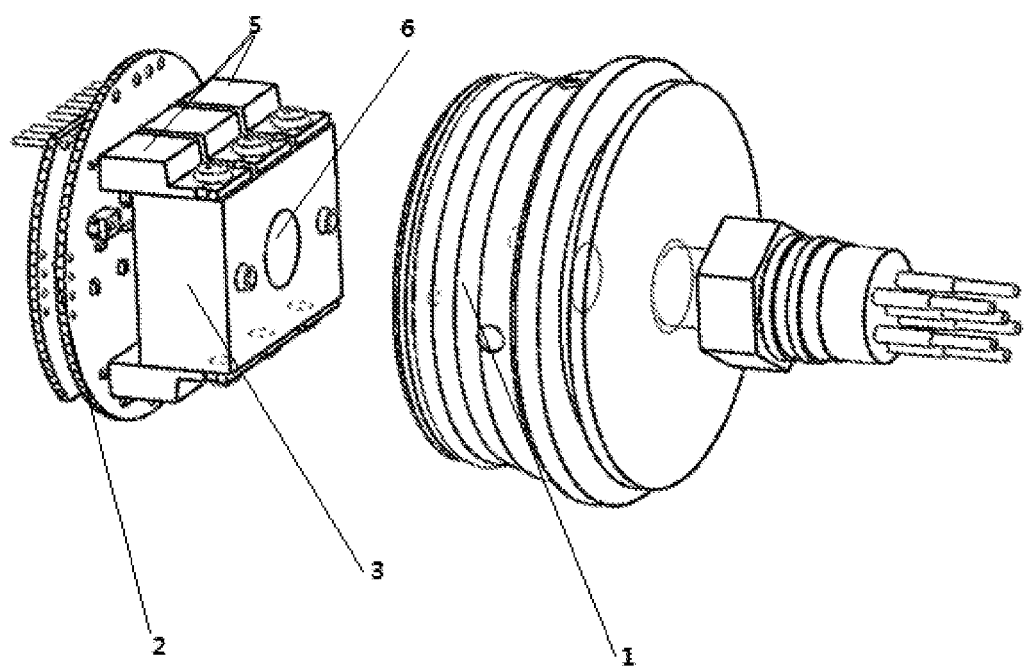
FIG. 2 is a structural diagram of an ROV propeller tailhood before assembled according to an embodiment of this disclosure.
Figure 3:
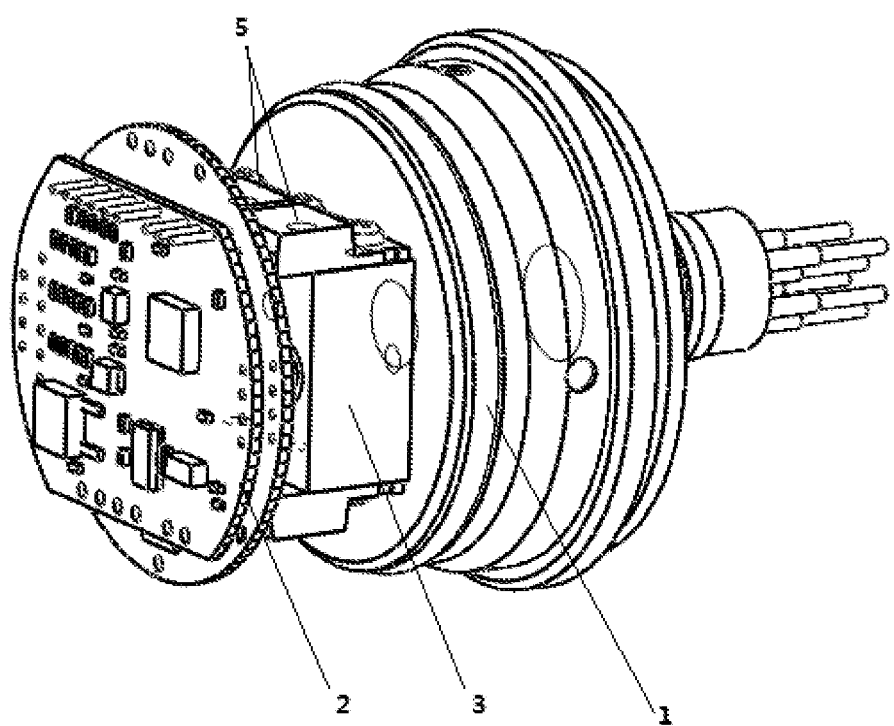
FIG. 3 is a structural diagram of an assembled ROV propeller tailhood after according to an embodiment of this disclosure.

Referring to FIGS. 1 to 3, an ROV propeller tailhood according to an embodiment of the disclosure comprises a body 1, and further comprises a control circuit board 2, a heat sink 3, a thermal silica gel (not shown in the accompanying drawings) and a long rod screws 4.

The heat sink 3 is fixed to the bottom of the control circuit board 2 and disposed between the control circuit board 2 and the body 1. Apertures 6 matching with the long rod screws 4 are provided respectively in the heat sink 3 and the body 1. The long rod screws 4 are used to fix the heat sink 3 onto the tailhood body 1. The cooling silica gel is filled into a space between the control circuit board 2 and the heat sink 3.

In the ROV propeller tailhood of the disclosure, a heat sink is fixed to the bottom of the control circuit board between the control circuit board and the body. Apertures 6 are arranged respectively in the heat sink and the body to match the long rod screws. The long rod screws are used to fix the heat sink onto the body, thereby fix the control circuit board onto the body, which provides a stable disposure during posture adjustment of the ROV and guarantees the stability of the control circuit on the control circuit board.

In addition, due to the addition of the heat sink on the basis of the heat dissipation silica gel, the heat dissipation performance is improved, which can ensure an efficient heat dissipation for the control circuit board during longtime working of ROV.

In some embodiments, the apertures 6 are provided in the middle of the heat sink 3 and in the middle of the end surface of body 1, respectively.

It would be appreciated that such an arrangement of the apertures can ensure a stable installation of the heat sink on the end surface of the body.

In some embodiments, the upper superficial area of the heat sink 3 is smaller than the bottom area of the control circuit board 2. The lower superficial area of the heat sink 3 is smaller than the superficial area of the end surface of the body 1.

It would be appreciated that such an arrangement can ensure that the edge of the heat sink does not exceed the edges of the control circuit board and the body, which provides a small volume of the heat sink, while avoiding noise caused by contact friction of the head sink with other components.

In some embodiments, the ROV propeller tailhood also comprises a plurality of motor driver modules 5. An end of each motor driver module 5 is fixed to the end of the control circuit board 2 with the other end thereof being fixed to the sidewall of the heat sink 3.

It would be appreciated that such an arrangement enables the heat sink to conduct heat dissipation not only for the control circuit board but also for the motor drive module.

In some embodiments, an end of each motor drive module 5 is fixed to the bottom of the control circuit board 2 through a cooling column with the other end thereof being fixed to the sidewall of the heat sink 3 through short rod screws.

It would be appreciated that such an arrangement ensures a stable position relationship among the motor drive modules, the control circuit board and the heat sink and hence a good heat dissipation effect.

In some embodiments, a plurality of motor drive modules 5 are equally divided into two groups which are provided on the opposite sidewalls of the heat sink 3 respectively.

It would be appreciated that such an arrangement ensures a force balance on the control circuit board, making the control circuit board parallel to the heat sink and keeping uniform heat dissipation for all portions of the control circuit board.

In some embodiments, there is a preset distance between two adjacent motor drive modules 5 in each group of motor drive modules.

It would be appreciated that such an arrangement ensures that the heat dissipation of each motor drive module will not be affected by its adjacent motor drive module, and there is no heat transfer between the two adjacent motor drive modules, which ensures a good cooling effect.

In another aspect, this disclosure relates to an ROV propeller comprising an ROV tailhood as mentioned above, wherein an insulating paper is provided on the inner wall of a cavity formed by the ROV tailhood and a propeller front cover.

It would be appreciated that such an arrangement avoids electric conduction to other parts of the ROV propeller to prevent electric leakage when short-circuit in the control circuit board occurs.

In some embodiments, the insulating paper 7 is a highland barley paper.

In a further aspect, this disclosure relates to an ROV comprising the ROV propeller as mentioned above.

The disclosure is not limited to the embodiments illustrated above. Variations made by those ordinary skilled in the art under the enlightenment in the disclosure, which are identical or equivalent to the solutions in this disclosure whether any changes in its shape or structure are made, shall fall within the scope of protection as defined by claims of this application. The term "first", "second", and "third" are applied for descriptive purpose only and are not intended to be interpreted as indicating or implying relative importance. The term "a plurality of" means two or more, unless otherwise specified.

What is claimed is:

1. An ROV propeller end cap comprising: a body wherein the body is approximately perpendicular to a main housing, and further comprising a control circuit board, a heat sink, a cooling silica gel and long rod screws, wherein the heat sink is fixed to the bottom of the control circuit board and disposed between the control circuit board and the body; the heat sink and the body are provided respectively with apertures matching with the long rod screws, and the long rod screws are used to fix the heat sink onto the body; the cooling silica gel is provided between the control circuit board and the heat sink.

2. The ROV propeller end cap according to claim 1, wherein apertures on the heat sink are provided in the middle of the heat sink, and the apertures on the body are provided in the middle of an end surface of the body.

3. The ROV propeller end cap according to claim 2, wherein an upper surface area of the heat sink is smaller than the bottom area of the control circuit board, and the lower surface area of the heat sink is smaller than a surface area of an end surface of the tail cover body.

4. The ROV propeller end cap according to claim 1, further comprising a plurality of motor driver modules, an end of each motor driver module being fixed to the bottom of the control circuit board, with the other end being fixed to the sidewall of the heat sink.

5. The ROV propeller end cap according to claim 4, wherein an end of each of the motor drive modules is fixed to the bottom of the control circuit board through a cooling column with the other end being fixed to the sidewall of heat sink through a short rod screw.

6. The ROV propeller end cap according to claim 5, wherein a plurality of motor drive modules are equally divided into two groups which are provided respectively to the opposite sidewalls of the heat sink.

7. The ROV propeller end cap according to claim 6, wherein there is a preset distance between the two adjacent motor drive modules in each group of the motor drive modules.

8. An ROV propeller end cap, comprising a body, and further comprising a control circuit board, a heat sink, a cooling silica gel and a long rod screws, wherein
the heat sink is fixed to the bottom of the control circuit board and disposed between the control circuit board and the body; the heat sink and the body are provided respectively with apertures matching with the long rod screws, and the long rod screws are used to fix the heat sink onto the body; the cooling silica gel is provided between the control circuit board and the heat sink,
apertures on the heat sink are provided in the middle of the heat sink, and the apertures on the body are provided in the middle of an end surface of the body,
an upper surface area of the heat sink is smaller than the bottom area of the control circuit board, and the lower surface area of the heat sink is smaller than a surface area of an end surface of the tail cover body.

9. The ROV propeller end cap according to claim 8, further comprising a plurality of motor driver modules, an end of each motor driver module being fixed to the bottom of the control circuit board, with the other end being fixed to the sidewall of the heat sink.

10. The ROV propeller end cap according to claim 9, wherein an end of each of the motor drive modules is fixed to the bottom of the control circuit board through a cooling column with the other end being fixed to the sidewall of heat sink through a short rod screw.

11. The ROV propeller end cap according to claim 10, wherein a plurality of motor drive modules are equally divided into two groups which are provided respectively to the opposite sidewalls of the heat sink.

12. The ROV propeller end cap according to claim 11, wherein there is a preset distance between the two adjacent motor drive modules in each group of the motor drive modules.

13. An ROV propeller end cap, comprising a body, and further comprising a control circuit board, a heat sink, a cooling silica gel and a long rod screws, wherein
the heat sink is fixed to the bottom of the control circuit board and disposed between the control circuit board and the body; the heat sink and the body are provided respectively with apertures matching with the long rod screws, and the long rod screws are used to fix the heat sink onto the body; the cooling silica gel is provided between the control circuit board and the heat sink,
further comprising a plurality of motor driver modules, an end of each motor driver module being fixed to the bottom of the control circuit board, with the other end being fixed to the sidewall of the heat sink.

14. The ROV propeller end cap according to claim 13, wherein an end of each of the motor drive modules is fixed to the bottom of the control circuit board through a cooling column with the other end being fixed to the sidewall of heat sink through a short rod screw.

15. The ROV propeller end cap according to claim 14, wherein a plurality of motor drive modules are equally divided into two groups which are provided respectively to the opposite sidewalls of the heat sink.

16. The ROV propeller end cap according to claim 15, wherein there is a preset distance between the two adjacent motor drive modules in each group of the motor drive modules.

* * * * *